United States Patent
Iyer et al.

(10) Patent No.: US 6,339,228 B1
(45) Date of Patent: Jan. 15, 2002

(54) DRAM CELL BURIED STRAP LEAKAGE MEASUREMENT STRUCTURE AND METHOD

(75) Inventors: Sundar K. Iyer, Beacon; Satya Chakravarti, Hopewell Junction; Subramanian S. Iyer, Mount Kisco, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/428,598

(22) Filed: Oct. 27, 1999

(51) Int. Cl.[7] ............... H01L 23/58; H01L 27/108; H01L 29/76; H01L 29/94; H01L 31/119
(52) U.S. Cl. ............... 257/48; 257/301; 438/248; 438/391
(58) Field of Search ............... 257/201, 304, 257/48; 438/248, 391

(56) References Cited

U.S. PATENT DOCUMENTS

| | | | |
|---|---|---|---|
| 5,185,294 A | * 2/1993 | Lam et al. | 438/515 |
| 5,670,805 A | * 9/1997 | Hammerl et al. | 257/301 |
| 5,914,512 A | * 6/1999 | Huang | 257/306 |
| 5,945,704 A | * 8/1999 | Schrems et al. | 257/301 |
| 6,140,199 A | * 10/2000 | Larsson et al. | 438/387 |

* cited by examiner

Primary Examiner—Olik Chaudhuri
Assistant Examiner—Howard Weiss
(74) Attorney, Agent, or Firm—Eric W. Petraske

(57) ABSTRACT

A test structure and method for determining DRAM cell leakage. The cell leakage test structure includes a pair of buried strap test structures. Each buried strap test structure includes multiple trench capacitors formed in a silicon body. Each trench capacitor is connected to a trench sidewall diffusion by at least one buried strap. An n-well ring surrounds each buried strap test structure and divides the buried strap test structure into two separate array p-wells, one being a contact area and the other a leakage test area. The contact area includes contacts to the trench capacitor plates for the corresponding buried strap test structure. In one buried strap test structure, a layer of polysilicon, essentially covers the trench capacitors in the leakage test area to block source/drain region formation there. The other of the two buried strap test structures includes polysilicon lines simulating wordlines with source and drain regions form on either side. A buried n-band contacts the n-well rings, essentially forming an isolation tub around each array well. Cell leakage is measured by measuring leakage current in each buried strap test structure, individually, and then extracting individual leakage components from the measured result.

21 Claims, 5 Drawing Sheets

DRAM CELL BURIED STRAP LEAKAGE MEASUREMENT STRUCTURE AND METHOD

BACKGROUND OF THE INVENTION

1. Field of the Invention

The present invention generally relates to semiconductor memories and, more particularly, to a test structure for determining leakage in dynamic random access memory cells.

2. Background Description

Dynamic Random Access Memory (DRAM) cells are well known. A DRAM cell is essentially a capacitor for storing charge coupled to a pass transistor (also called a pass gate or access transistor) for transferring charge to and from the capacitor. The absence or presence of charge on the capacitor corresponds to a logic value of data stored in the cell. Because cell size determines chip density, size and cost, reducing cell area is one of the DRAM designer's primary goals.

Reducing cell area is done, normally, by shrinking feature sizes to shrink the cell. In addition to shrinking the cell features, the most effective way to reduce cell area is to reduce the largest feature in the cell, typically, the area of the storage capacitor. Unfortunately, shrinking the capacitor area reduces capacitance and, consequently, reduces stored charge. Reduced charge means what is stored in the DRAM is more susceptible to noise, soft errors, leakage and other typical DRAM problems. Consequently, a DRAM cell designer's goal is also to maintain storage capacitance, thereby maximizing stored charge without sacrificing cell area.

One way to reduce DRAM cell size without necessarily reducing storage capacitance is to use trench capacitors in the cells. Typically, trench capacitors are formed by etching long deep trenches in a silicon wafer, selectively doping the trench sidewalls, coating the trench with a dielectric layer and then, filling the coated trench with polysilicon or amorphous silicon to form a cell capacitor on its side in the trench. Thus, the surface area required for the storage capacitor is dramatically reduced without sacrificing capacitance, and more importantly, stored charge.

However, even though the storable charge may be maintained, cell leakage may still be a problem. Typical cell leakage occurs at pn junctions. Thus, the capacitor plate, which is surrounded by dielectric, is the optimum charge storage node for minimized leakage. However, to transfer data in and out of the cell, the capacitor plate must be connected to a cell access transistor, typically a field effect transistor (FET). This connection is to the FET's source diffusion, i.e., a pn junction, which becomes the primary source of cell leakage. To understand how cell leakage occurs, this connection must be characterized precisely.

For state of the art DRAM cells, the trench capacitor plate is strapped to the source diffusion with doped polysilicon. Typically, the doped polysilicon strap forms a pn junction which is, or merges with the source diffusion junction. State of the art leakage measurement techniques measure the combined strap and source diffusion leakage. Leakage at the strap junction is difficult to accurately quantify from the total DRAM cell leakage measured using these state of the art test techniques. So, typically, the strap junction leakage must be estimated from the total cell leakage. Without precise measurements, it is difficult to determine how to further improve cell structures to reduce cell leakage.

Thus there is a need for DRAM cell capacitor connection test structures and methods for characterizing and testing such structures.

SUMMARY OF THE INVENTION

It is therefore a purpose of the present invention to decrease the Dynamic Random Access Memory (DRAM) cell leakage;

It is another purpose of the present invention to accurately measure DRAM cell storage capacitance leakage;

It is yet another purpose of the present invention to characterize DRAM cell trench capacitor plate leakage;

It is yet another purpose of the present invention to characterize DRAM cell trench capacitor plate to access transistor connection leakage;

It is yet another purpose of the present invention to characterize DRAM cell trench capacitor leakage in order to provide DRAM cell designers with cell characterization information for improving DRAM cell designs.

The present invention is a test structure and method for determining DRAM cell leakage. The test structure includes a pair of buried strap test structures. Each buried strap test structure includes multiple trench capacitors formed in a silicon body. Each trench capacitor is connected to a trench sidewall diffusion by at least one buried strap. An n-well ring surrounds each buried strap test structure and divides the buried strap test structure into two separate array p-wells, one being a contact area and the other a leakage test area. For each buried strap test structure, the contact area includes contacts to the trench capacitor plates for that buried strap test structure. In one buried strap test structure, a layer of polysilicon, essentially covers the trench capacitors in the leakage test area to block source/drain region formation there. The other of the two buried strap test structures includes polysilicon lines that simulate wordlines with source and drain regions formed on either side. A buried n-band contacts both n-well rings, essentially forming an isolation tub around each array well. Cell leakage is measured by measuring leakage current in each buried strap test structure, individually. Then, individual leakage components are extracted from the measured result.

BRIEF DESCRIPTION OF THE DRAWINGS

The foregoing and other objects, aspects and advantages will be better understood from the following detailed preferred embodiment description with reference to the drawings, in which.

DETAILED DESCRIPTION OF A PREFERRED EMBODIMENT OF THE INVENTION

Figure 1:
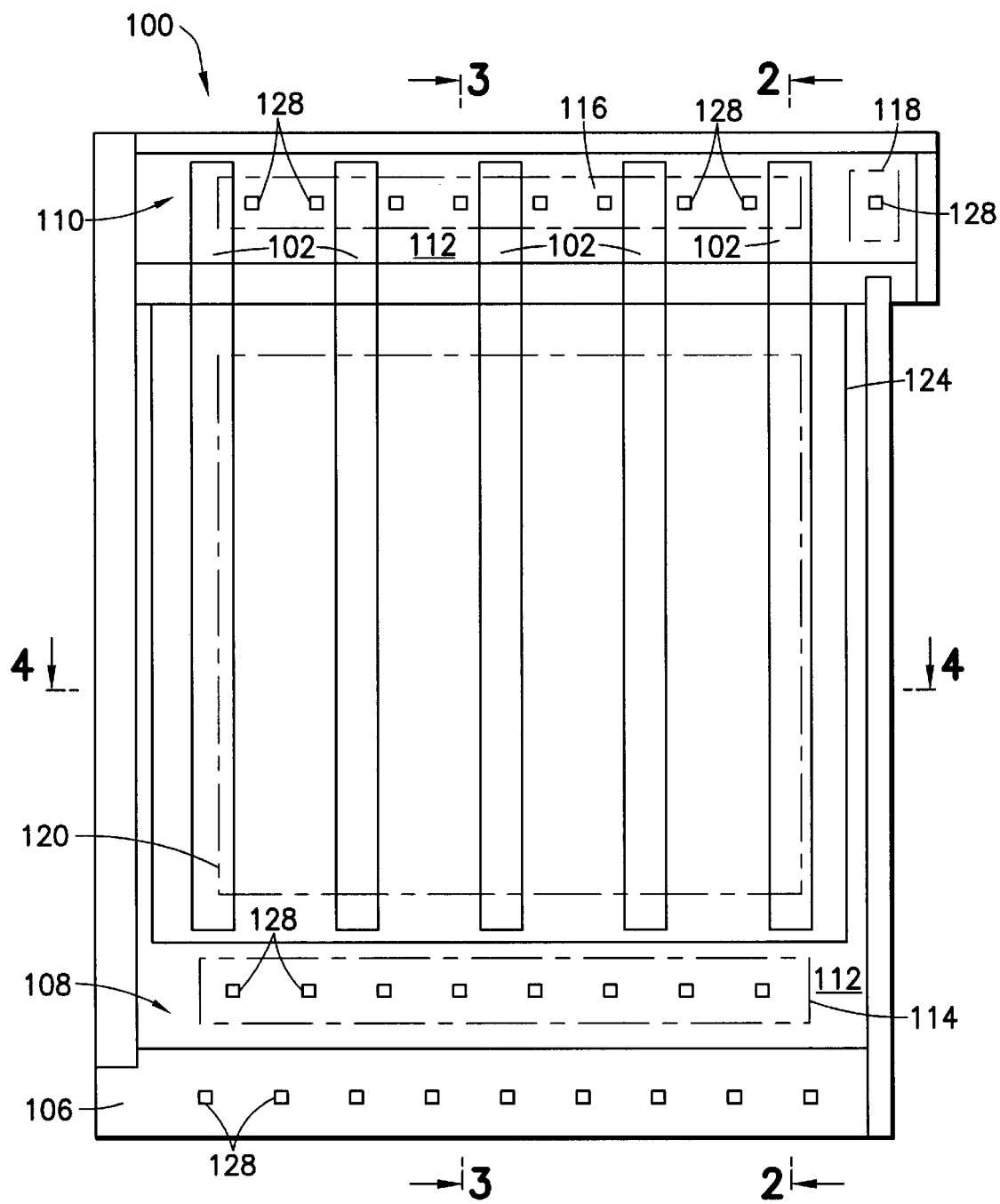
FIG. 1 is a plan view of a first buried strap test structure of the preferred embodiment test structure of the present invention.
Figure 2:
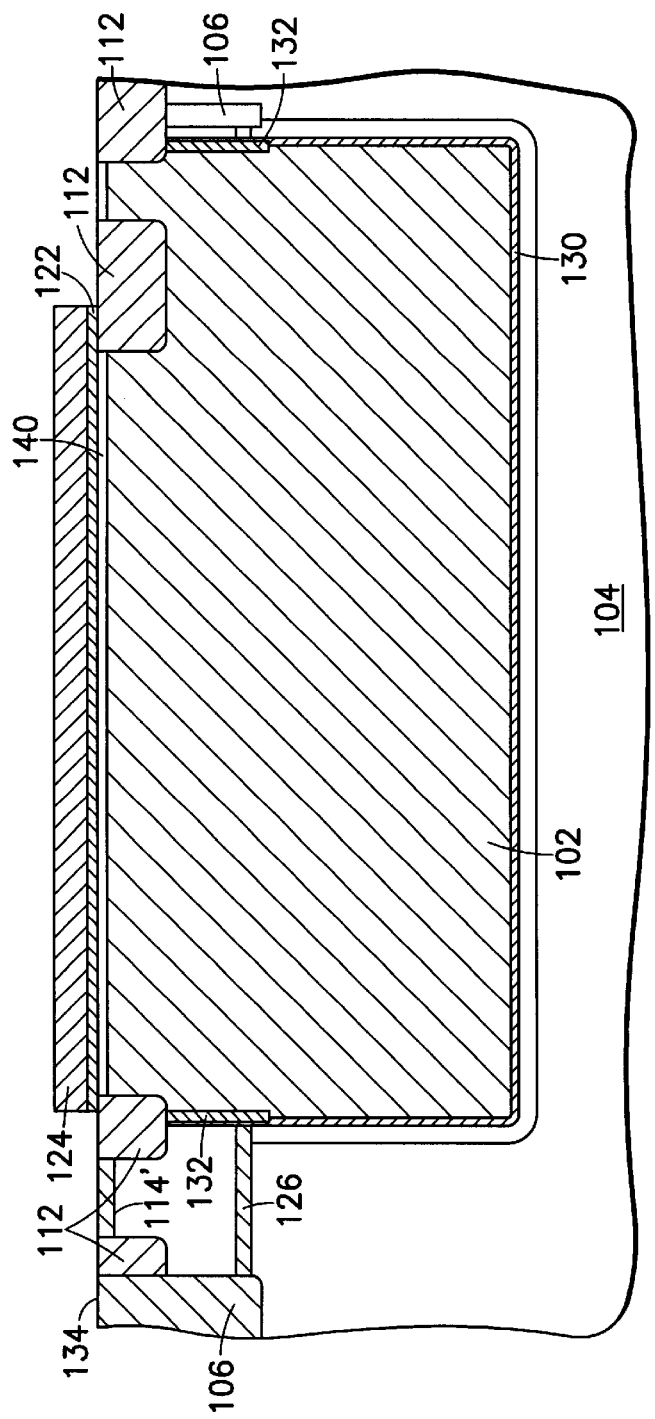
FIG. 2 is a first cross-section of the first buried strap test structure of FIG. 1.
Figure 3:
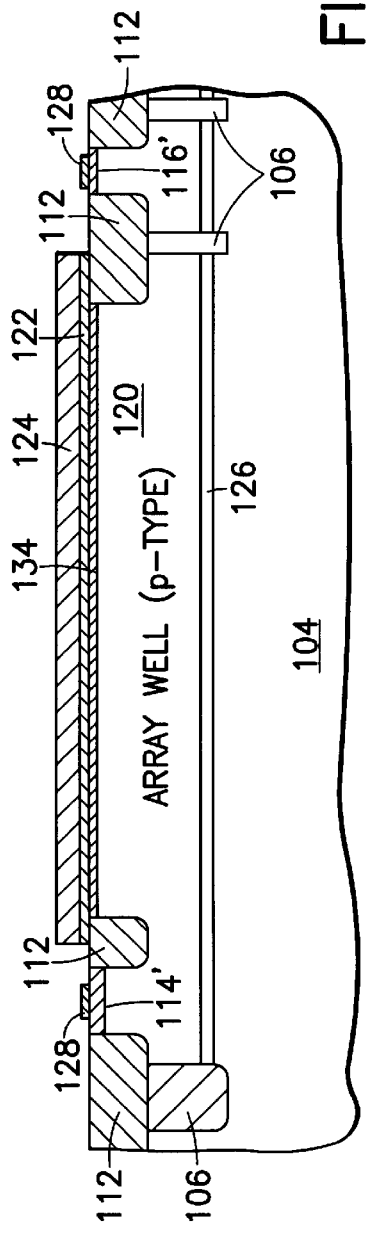
FIG. 3 is a second cross-section of the first buried strap test structure of FIG. 1.
Figure 4:
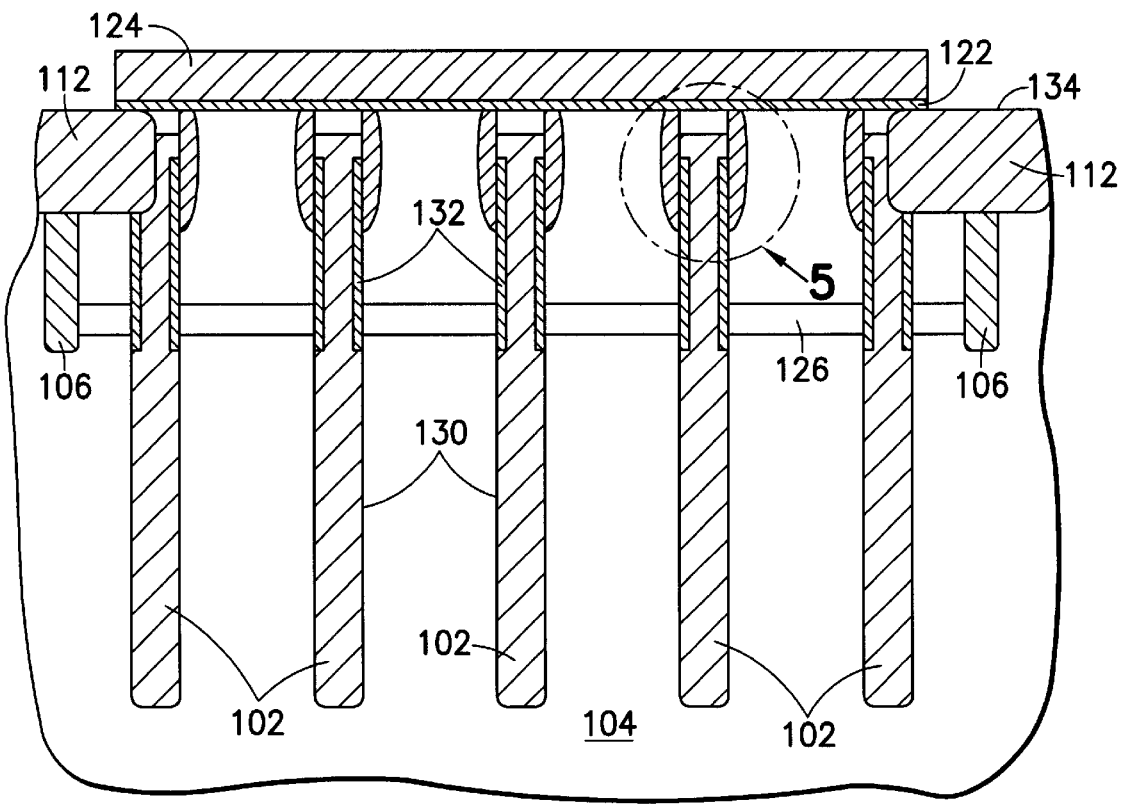
FIG. 4 is a third cross-section of the first buried strap test structure of FIG. 1.

Referring now to the drawings, and more particularly, FIG. 1 shows a plan view of a first buried strap test structure 100 of the preferred embodiment cell leakage test structure of the present invention. The preferred embodiment cell leakage test structure includes two (2) buried strap test structures, an isolated buried strap test structure 100 of FIG. 1 and, a second structure wherein the buried straps are connected to source diffusions as described hereinbelow. Thus, the first test structure 100 includes a large isolated strap junction area for isolating and determining strap diffusion leakage. FIG. 2 is a cross-section of the first test structure 100 of FIG. 1 through 2—2. FIG. 3 is a cross-section of the first test structure 100 of FIG. 1 through 3—3. FIG. 4 is a cross-section of the first test structure 100 of FIG. 1 through 4—4.

It should be noted that the strap is described herein as n-type for example only and not as a limitation. The present invention may be used advantageously for measuring memory cell leakage in a cell with a p-type strap, as well, with appropriate changes to dopant types, device types and voltages without departing from the spirit or scope of the invention.

The first preferred structure 100 includes one or more deep trench capacitor structures 102 formed in a semiconductor body such as a silicon substrate, labeled 104 in FIGS. 2–4. Although, FIGS. 1–4 show five parallel deep trench capacitor structures 102, this is for example only and more or fewer such capacitor structures 102 may be included. Further, since the first buried strap test structure 100 is formed for strap leakage measurement purposes only, other features of the deep trench structures 102 are not critical to the understanding of the invention. Accordingly, for simplicity of description, the deep trench capacitor structures 102 are taken as formed using a state of the art DRAM process. For further simplicity, the trench capacitor structures 102 are referred to hereinbelow as trench capacitors and trench capacitor plate is intended to refer to the silicon plate formed in the trenches.

Additionally, it is understood that unmeasured features or features not contributing to strap leakage may be omitted from the test structure deep trench capacitors 102. Such omitted features may include, but are not limited to trench depth, trench width, trench dielectric material type and thickness and to the common capacitor plate typically formed by trench diffusion. Generally, however, the preferred test structure is intended to be formed on or with DRAM chips. Accordingly, it is intended that the preferred test structure be formed coincidentally with and identically with DRAM cells on the DRAM chips.

An n-type well or n-well ring 106 surrounds and separates two array wells, leakage test area 108 and contact area 110. The n-well ring 106 isolates leakage test area 108 and contact area 110 from surrounding structures (not shown) and from each other. Shallow trenches 112 formed in the upper silicon substrate surface of leakage test area 108 and contact area 110 define contact islands 114, 116, 118 and an active array area 120. Contact islands 114 and 118 include a thin p-type surface region (114' in FIGS. 2 and 3) for providing a resistive contact to array wells in leakage test area 108 and contact area 110, respectively. Contact island 116 includes a thin n-type surface region (116' in FIG. 3) for providing a resistive contact to trench capacitor plates 102 through buried straps described hereinbelow. A dielectric layer 122 on the surface of active array area 120 isolates area 120 from a polysilicon layer 124, which covers it entirely. Optionally, although not shown in the figures, the polysilicon layer 124 may include a contact.

A buried n-type layer or, n-band 126, extends under leakage test area 108 and contact area 110 and between n-well ring sides. The n-band 126 in combination with n-well ring 106 completely encloses leakage test area 108 and contact area 110 in n-type silicon and isolates these areas 108, 110 from the p-type substrate therebelow. Contacts 128 are provided to n-well ring 106 and at contact islands 114, 116 and 118. Contact islands 114 and 118 are doped with p-type dopant and contact island 116 is doped with n-type dopant.

As can best be seen from the cross section of FIG. 4, the deep trenches are lined with a thin dielectric layer 130. A dielectric isolation collar 132 extends upward along trench sidewalls adjacent to the dielectric layer 130 from a point below the n-band 126, to a point below the surface 134 of active area 120. Typically, the trench capacitor plates 102 are silicon, polysilicon or, preferably, amorphous silicon. The capacitor plates fill the trenches to a point between surface 134 and the upper edge of the isolation collar 132.

The trenches 102 are, preferably, 7.5 $\mu$m deep and 0.4 $\mu$m wide. It should be noted, however, that features depicted in the drawings are not to scale. Individual trench length is not critical, provided the trenches 102 are of sufficient length to adequately measure strap 136 and diffusion 138 leakages. Generally, the longer the trenches 102, the better. Preferably, the length of the trench portion in leakage test area 108 is more than one hundred times the length of that portion of the same trench in contact area 110. Spacing between the trenches 102 should be more than twice the strap outdiffusion.

Figure 5:
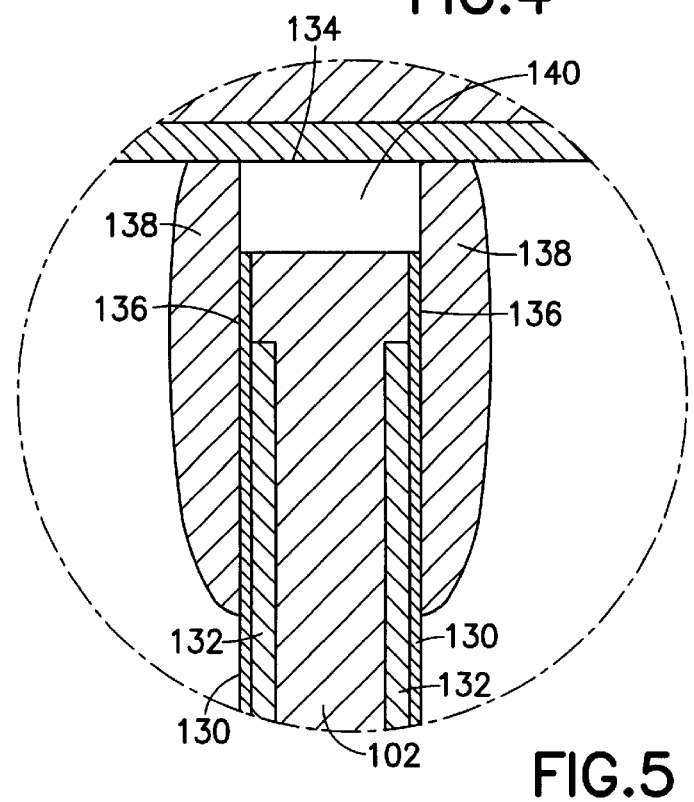
FIG. 5, which is a blow-up of a strap area of FIG. 4.

Turning to FIG. 5, which is a blow-up of area 5 of FIG. 4, doped polysilicon straps 136 are formed in this example between the plates 102 and the trench sidewall. Dopant from the doped polysilicon straps 136 outdiffuses to form diffusions 138, thereby forming self aligned contacts between the plates 102 and the diffusions 138. It is leakage at this self aligned contact diffusion 138 that is measured by the cell leakage test structure of the present invention. The top of the trenches are filled with a dielectric material 140, such as silicon dioxide.

Figure 6:
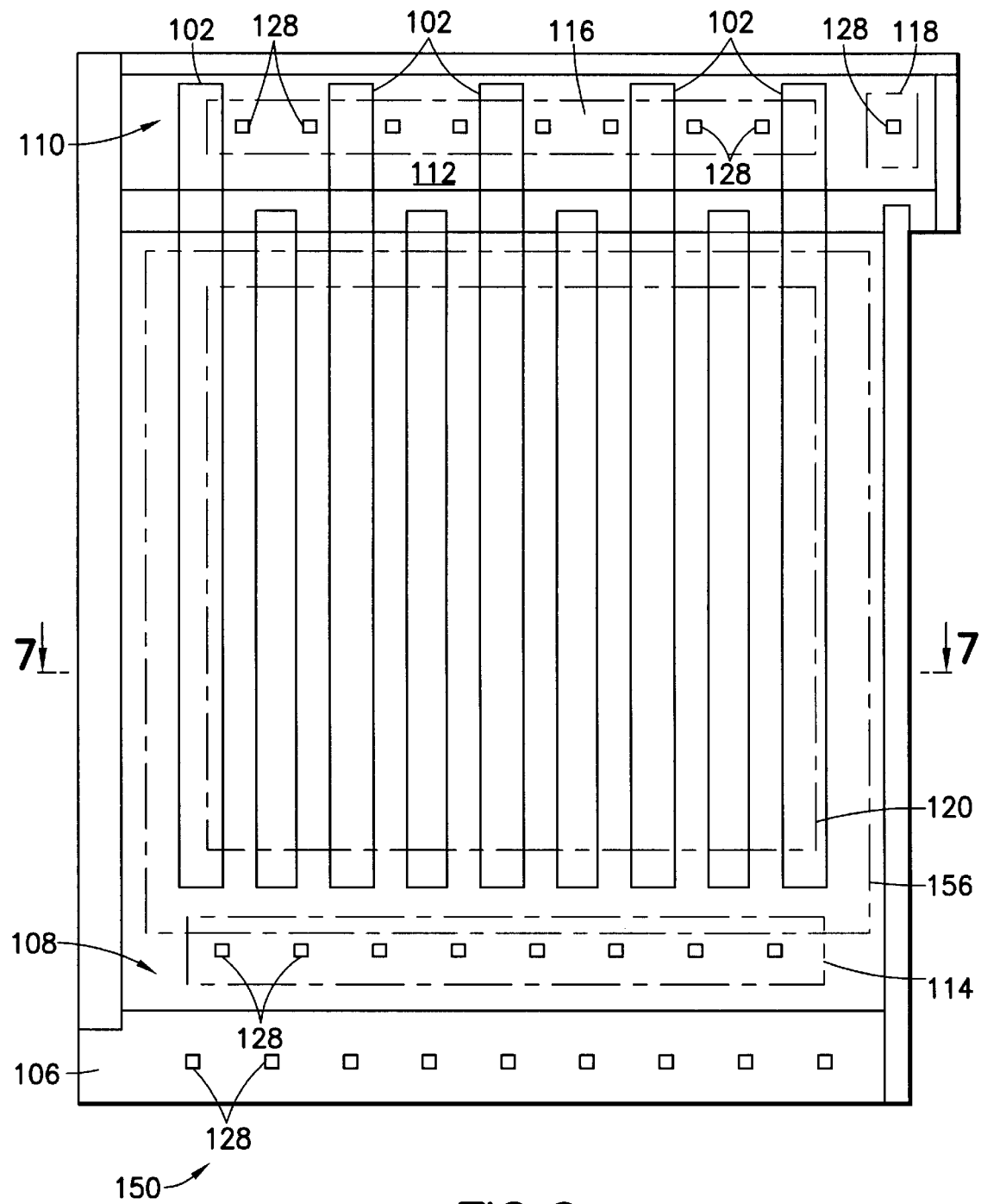
FIG. 6 shows a plan view of a second buried strap test structure of the preferred embodiment test structure of the present invention.
Figure 7:
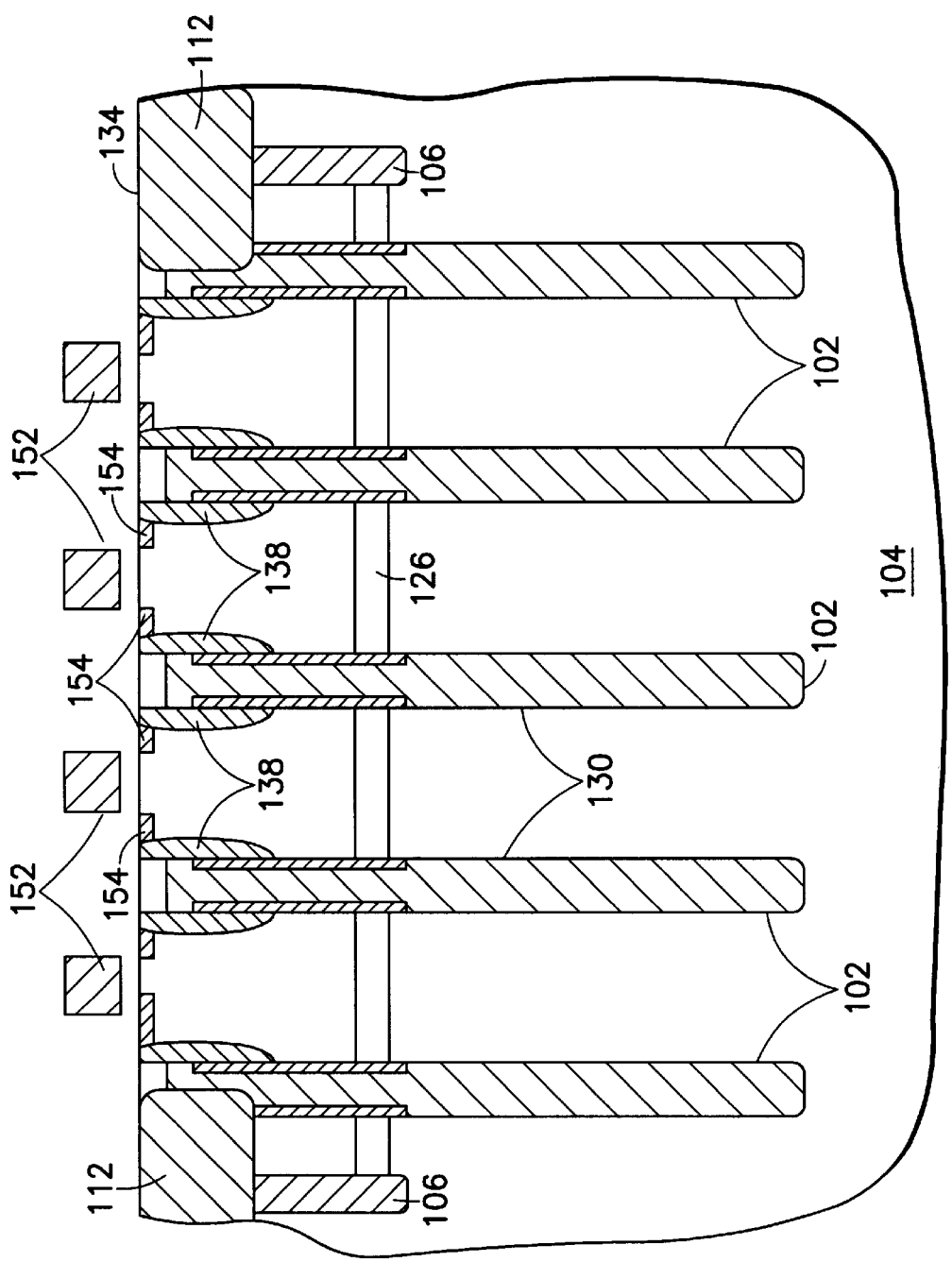
FIG. 7 is a cross-section of the second buried strap test structure of FIG. 6.

Having described the first buried strap test structure 100 of the preferred embodiment cell leakage test structure, a plan view of the second buried strap test structure 150 of the preferred embodiment is shown in FIG. 6. FIG. 7 is a cross-section of the second test structure 150 of FIG. 6 through 7—7. The second test structure 150 is substantially similar to the first test structure 100, except polysilicon gates 152 replace polysilicon plate 124 and, the trenches may be spaced farther apart. In polysilicon gates 152, which are similar to, and preferably, the same length as array wordlines, are formed between the trench capacitors 102. Optionally, although not shown in the figures, the polysilicon gates 152 may each include a contact.

Thus, when a source/drain implant is performed, polysilicon layer 124 blocks the implant in the first structure 100; while in second structure 150, rectangle 156 defines where source/drain regions 154 are formed in surface 134. Source/drain regions 154 are formed in contact with buried strap diffusions 138 to provide a self-aligned buried contact between capacitor plates 102 and source/drain diffusions 156. Thus, the trench spacing in the second test structure 150 must be at least twice the actual DRAM device source/drain diffusion width. Preferably, the distance between trenches 102 in structure 150 is twice the actual DRAM device source/drain diffusion width plus the access transistor gate length, i.e., wordline width.

Preferably, when the preferred embodiment structure is included for DRAM chip or process characterization, for accurate device leakage simulation the spacing between the trench capacitors 102 and the polysilicon gates 152 is identical to the spacing between deep trench capacitors and wordlines in arrays for which the measurements are being taken. Further, the device junctions 156 formed on the second structure 150 are formed identically to corresponding device junctions in array cells, along the horizontal direction perpendicular to wordlines. Thus, spacers, e.g., for lightly doped drain diffusions (not shown), may be formed along the polysilicon gates 152, identically to those formed in DRAM cells.

Measuring strap junction 138 leakage is a two step measurement. First, leakage is measured on one structure, e.g., first structure 100 and, then, an identical measurement is made on the other structure, second structure 150. In each measurement, The capacitor plates 102 are held at a relatively high positive voltage, preferably corresponding to the normal DRAM cell storage voltage, e.g., 1.8V, which is provided at contact island 116. The contact area 108 is biased at the particular normal DRAM triple well (the p-well in this example) operating bias, e.g., −0.5V, and provided at contact island 114. The n-well ring 106, n-band 126 and contact area 110 may be left floating. While taking measurements, the polysilicon layer 124 and polysilicon lines 152, preferably, are biased at a voltage equal to the wordline's off voltage for the technology being measured. Having thus biased the structure 100 or 150, the bias current is measured between contact islands 114 and 116. Optionally, for enhanced measurement accuracy, junction leakages also may be measured for the individual array wells 108, 110 and n-well ring 106 and n-band 126.

The bias current measured in first test structure 100 is the sum of the leakage in all of the buried strap junctions 138. The bias current measured in second test structure 150 is the sum of the leakage in all of the source/drain diffusions 154 and of the buried strap junctions 138. This measured leakage current value is divided by the sum of the lengths of the junctions, i.e., along the plates 102, to determine a per unit length junction leakage. Using the values measured and calculated for both first test structure 100 and second test structure 150, the individual leakage components, the buried strap junction 138 and source/drain diffusion 154 leakage, can be extracted. The extracted components correspond to leakage for DRAM cells on the chip or wafer containing the test structure and provide an accurate representation of leakage for the particular DRAM technology.

The individual leakage values derived from this measurement provide improved accuracy in the buried strap junction leakage current measurement. Thus, for a particular DRAM technology, process parameters, e.g., strap dopant, strap formation, source/drain implant dopant concentration or implant voltage, may be varied. The effects on buried strap leakage of those varied parameters measured. Then, an optimum process point may be selected based on the measurement results.

Accordingly, buried strap leakage can be measured, directly, on a DRAM chip or wafer that includes the preferred embodiment cell leakage test structure, i.e., both first and second buried strap test structure 100 and 150. Such a measurement is much more accurate than extracting a value from other indirect measurements. As a result of information that is gathered from such DRAM chips and wafers, DRAM cell retention time may be improved.

While the invention has been described in terms of preferred embodiments, those skilled in the art will recognize that the invention can be practiced with modification within the spirit and scope of the appended claims.

We claim:

1. A Dynamic Random Access Memory integrated circuit comprising:
   a memory array of DRAM cells formed in a semiconductor substrate, isolated from one another and each having an access transistor connected by a buried strap to a trench capacitor having a cell capacitor depth, a cell capacitor width and a cell capacitor length;
   a test capacitor structure formed in said semiconductor substrate, and separated from said memory array for determining memory cell leakage, said test structure comprising:
      two test wells doped with a first polarity dopant and separated horizontally by a barrier well doped with a polarity opposite said first polarity;
      at least two trenches formed in said semiconductor substrate, each of said at last two trenches having said cell capacitor depth, said cell capacitor width and a test capacitor length greater than twice said cell capacitor length and extending horizontally from a first test well across said barrier well and into a second test well;
      a capacitor plate disposed in each said at least one trench and separated from said semiconductor substrate by an insulator, whereby said capacitor plate, said insulator and said trench form a test capacitor;
      at least two buried straps connecting each capacitor plate to a sidewall of a corresponding trench; and
      conductive means connecting said at least two buried straps, whereby said at least two test capacitors are connected in parallel.

2. A test structure as in claim 1 wherein at least one trench is a plurality of trenches grouped into a first group and a second group, a layer of semiconductor material being disposed over a portion of trenches in said first group.

3. A test structure as in claim 2, further comprising:
   at least one line of semiconductor material adjacent to a conductive region in said surface, said conductive region further being adjacent to one trench of said second group of trenches.

4. A test structure as in claim 3 wherein the semiconductor body is a silicon substrate, the capacitor plates are amorphous silicon and the semiconductor material is polysilicon.

5. A test structure as in claim 4, wherein the first group and the second group each comprise a plurality of parallel trenches.

6. A test structure as in claim 5, wherein at least one line is a plurality of lines, each of said plurality of lines being disposed between a pair of said parallel trenches.

7. A test structure as in claim 6, wherein the plurality of parallel trenches is five (5) trenches and the plurality of lines is four (4) polysilicon lines.

8. A test structure as in claim 7 wherein each buried strap is a doped polysilicon strap, each doped polysilicon strap being doped with a dopant of a first conductivity type.

9. A test structure as in claim 8, further comprising:
   a well of a first conductivity type surrounding each group of trenches and, further, dividing an area on a surface of said semiconductor body at each said group of trenches into a contact area and a test area, both of a second conductivity type.

10. A test structure as in claim 9 wherein the first conductivity type is n-type and the second conductivity type is p-type.

11. A test structure as in claim 10 wherein the contact area at each of said groups includes a n-type surface layer, diffusion from said buried straps in said contact area merging with said n-type surface layer.

12. A test structure as in claim 11 further comprising an n-band layer beneath said surface and in contact with each n-well, each said n-well and said n-band isolating each said contact area and each said test area from said silicon substrate.

13. A Dynamic Random Access Memory (DRAM) site including an array of trench capacitor memory cells, said DRAM site further including a cell leakage test structure, said cell leakage test structure comprising:
- a plurality of parallel trenches through a surface of a silicon substrate;
- a silicon capacitor plate disposed in each of said trenches;
- at least one buried strap connecting each capacitor plate to a sidewall of a corresponding one of said trenches;
- a polysilicon layer over a portion of one or more of said trenches;
- at least one polysilicon line between a pair of said trenches; and
- a conductive region of a first conductivity type in said surface on each side of each said at least one polysilicon line, each said conductive region further being between one of said trenches and said at least one polysilicon line.

14. A Dynamic Random Access Memory (DRAM) site as in claim 13, wherein at least one polysilicon line is four (4) polysilicon lines and one or more trenches is five (5) trenches.

15. A Dynamic Random Access Memory (DRAM) site as in claim 13, wherein each buried strap is a doped polysilicon strap, said buried strap being doped with a dopant of said first conductivity type and said dopant being diffused from said strap into said contacted sidewall.

16. A Dynamic Random Access Memory (DRAM) site as in claim 15, wherein trenches partially covered by said polysilicon layer are in a first area and trench pairs separated by said polysilicon lines are in a second area, said cell leakage test structure in each of said first area and second area further comprising:
- a well of said first conductivity type surrounding said trenches and, further, dividing said first area and second area into a contact area and a test area, both of a second conductivity type.

17. A Dynamic Random Access Memory (DRAM) site as in claim 16, wherein the first conductivity type is n-type and the second conductivity type is p-type.

18. A Dynamic Random Access Memory (DRAM) site as in claim 17, further comprising an n-band layer beneath said surface and in contact with each n-well, each said n-well and said n-band isolating each said contact area and test area from said silicon substrate.

19. A Dynamic Random Access Memory (DRAM) site as in claim 18, wherein each contact area includes a n-type surface layer, diffusion from said buried straps in said second array wells merging with said n-type surface layer.

20. A Dynamic Random Access Memory (DRAM) site as in claim 19, wherein said DRAM site is a DRAM chip.

21. A Dynamic Random Access Memory (DRAM) site as in claim 19, wherein said DRAM site is a DRAM wafer including a plurality of DRAM chips.

* * * * *